US008883649B2

(12) United States Patent
Yin et al.

(10) Patent No.: US 8,883,649 B2
(45) Date of Patent: Nov. 11, 2014

(54) SIDEWALL IMAGE TRANSFER PROCESS

(75) Inventors: Yunpeng Yin, Albany, NY (US); John C. Arnold, Albany, NY (US); Matthew E. Colburn, Yorktown Heights, NY (US); Sean D. Burns, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 879 days.

(21) Appl. No.: 13/069,536

(22) Filed: Mar. 23, 2011

(65) Prior Publication Data
US 2012/0244711 A1  Sep. 27, 2012

(51) Int. Cl.
| | |
|---|---|
| *H01L 21/302* | (2006.01) |
| *H01L 21/461* | (2006.01) |
| *H01L 21/033* | (2006.01) |
| *H01L 21/311* | (2006.01) |
| *H01L 21/3213* | (2006.01) |
| *H01L 21/308* | (2006.01) |

(52) U.S. Cl.
CPC ...... *H01L 21/0337* (2013.01); *H01L 21/31144* (2013.01); *H01L 21/32139* (2013.01); *H01L 21/3086* (2013.01)
USPC ............................. 438/706; 438/717; 438/736

(58) Field of Classification Search
CPC ........ H01L 21/0334–21/0337; H01L 21/3086; H01L 21/32139; H01L 21/31144
USPC ........ 438/694, 706, 717, 736, 942, FOR. 473
See application file for complete search history.

(56) References Cited

U.S. PATENT DOCUMENTS

| | | | |
|---|---|---|---|
| 6,841,449 B1 * | 1/2005 | Bertrand et al. | 438/299 |
| 6,875,703 B1 | 4/2005 | Furukawa et al. | |
| 7,381,655 B2 | 6/2008 | Furukawa et al. | |
| 2004/0106297 A1 * | 6/2004 | Kanegae et al. | 438/725 |
| 2006/0046422 A1 * | 3/2006 | Tran et al. | 438/401 |
| 2007/0049040 A1 * | 3/2007 | Bai et al. | 438/712 |
| 2007/0066009 A1 | 3/2007 | Furukawa et al. | |
| 2008/0206996 A1 | 8/2008 | Furukawa et al. | |
| 2009/0117742 A1 | 5/2009 | Jung | |
| 2010/0105210 A1 | 4/2010 | Chen et al. | |
| 2010/0136791 A1 | 6/2010 | Lai et al. | |

FOREIGN PATENT DOCUMENTS

WO   2011022635 A3   2/2011

OTHER PUBLICATIONS

Notification of Transmittal of the International Search Report and the Written Opinion of the International Searching Authority, or the Declaration, dated Oct. 31, 2012.

* cited by examiner

*Primary Examiner* — Jae Lee
*Assistant Examiner* — Quovaunda V Jefferson
(74) *Attorney, Agent, or Firm* — Yuanmin Cai

(57) ABSTRACT

An improved method of performing sidewall spacer imager transfer is presented. The method includes forming a set of sidewall spacers next to a plurality of mandrels, the set of sidewall spacers being directly on top of a hard-mask layer; transferring image of at least a portion of the set of sidewall spacers to the hard-mask layer to form a device pattern; and transferring the device pattern from the hard-mask layer to a substrate underneath the hard-mask layer.

21 Claims, 12 Drawing Sheets

SIDEWALL IMAGE TRANSFER PROCESS

FIELD OF THE INVENTION

The present invention relates to the field of semiconductor device manufacturing. In particular, it relates to a sidewall image transfer process with improved control on critical dimensions.

BACKGROUND

Semiconductor device manufacturing generally includes various steps of device patterning process. For example, the manufacturing of a semiconductor chip may start with, for example, CAD (computer aided design) generated device patterns and may continue with the effort to replicate these device patterns in a substrate thereupon semiconductor devices are formed. The replication process may involve the use of various exposing techniques, and a variety of subtractive (etching) and additive (deposition) material processing procedures. For example, in a photolithography process, a layer of photo-resist material may be first applied on top of a substrate, and then be selectively exposed according to a pre-determined device pattern. Portions of the photo-resist that are exposed to light or other ionizing radiation (e.g., ultraviolet, electron beams, X-rays, etc.) may experience some changes in their solubility to certain solution. Next, the photo-resist may be developed in a developer solution, thereby removing the non-irradiated (in a negative resist) or irradiated (in a positive resist) portions of the resist layer, to create a photo-resist pattern. The photo-resist pattern may subsequently be copied or transferred to the substrate underneath the photo-resist pattern.

With continuous scale-down and shrinkage of real estate available for a single semiconductor device, engineers are daily facing the challenge of how to meet the market demand for ever increasing device density. One technique for sub-80 nm pitch patterning is to achieve twice the pattern density through a technique called sidewall image transfer (SIT), also known as sidewall spacer image transfer. However in a conventional SIT process, spacer deposition is performed right after the mandrel litho development. In other words, photo-resist mandrels are first formed, often with the help of an anti-reflective coating (ARC) layer underneath thereof, and material suitable for forming spacers is subsequently deposited to eventually form spacers next to the photo-resist mandrels.

However, concerns and issues have been observed in the above conventional SIT process. For example, imperfection and/or undesired characters have been found in the shapes of above photo-resist mandrels. Such imperfection and/or undesired characters may include, for example, resist footing and slightly tapered profile on the top of the mandrels. In addition to issues relating to the photo-resist mandrels, in the spacer etch-back process of the above conventional process, the etching process is generally not selective to the anti-reflective coating or ARC layer underneath the spacer material layer. As a result, thickness of the ARC layer, after spacer etch-back, often exhibits difference in mandrel-defined trench and spacer-defined trench. Such difference in thickness of ARC layer may result in different shrink at subsequent etch and cause CD (critical dimension) variations, line edge roughness (LER), and pitch walking.

SUMMARY OF THE INVENTION

Embodiments of the present invention provide a method of performing sidewall spacer image transfer for semiconductor device manufacturing. The method includes forming a set of sidewall spacers next to a plurality of mandrels, the set of sidewall spacers being directly on top of a hard-mask layer; transferring image of at least a portion of the set of sidewall spacers to the hard-mask layer to form a device pattern; and transferring the device pattern from the hard-mask layer to a substrate underneath the hard-mask layer.

In one embodiment, forming the set of sidewall spacers includes creating the plurality of mandrels from a planarization layer, the planarization layer being directly on top of the hard-mask layer; depositing a conformal layer of dielectric material suitable for the sidewall spacers covering the plurality of mandrels; and performing directional etching of the conformal layer to create the set of sidewall spacers.

In one embodiment, creating the plurality of mandrels includes depositing an anti-reflective coating layer on top of the planarization layer; forming a photo-resist pattern of the plurality of mandrels lithographically on top of the anti-reflective coating layer; transferring the photo-resist pattern into the planarization layer through directional etching of the planarization layer utilizing the hard-mask layer underneath thereof as an etch-stop layer.

Embodiment of the present invention further includes forming a photo-resist block mask, the photo-resist block mask exposing only the at least a portion of the set of sidewall spacers and covering rest of the set of sidewall spacers.

In one embodiment, the above hard-mask layer is a second hard-mask layer and wherein transferring the device pattern from the second hard-mask layer to the substrate further includes transferring the device pattern to a first hard-mask layer, the first hard-mask layer being underneath the second hard-mask layer and separated from thereof by a planarization layer.

Embodiment further includes removing the sidewall spacers remaining on top of the device pattern of the second hard-mask layer and the rest of the second hard-mask layer through a burn-off process. In one embodiment, the burn-off process may include subjecting the sidewall spacers to a plasma environment, wherein the plasma environment may include fluorocarbon gas of CF4 or C4F8, hydrogenated fluorocarbon gas CHxFy, and diluting gases of Ar or nitrogen.

In one embodiment, the first and second hard-mask layers are titanium-nitride layers and wherein the planarization layer is of a material that is able to withstand a process of depositing the second titanium-nitride layer on top thereof without causing decomposition.

In one embodiment, the second hard-mask layer has a thickness that is equal or less than that of the first hard-mask layer, and wherein the planarization layer has a thickness ranging from about 10 nm to about 100 nm. In another embodiment, the planarization layer is an amorphous carbon layer.

BRIEF DESCRIPTION OF THE DRAWINGS

The invention will be understood and appreciated more fully from the following detailed description of preferred embodiments, taken in conjunction with the accompanying drawings of which.

Figure 1:
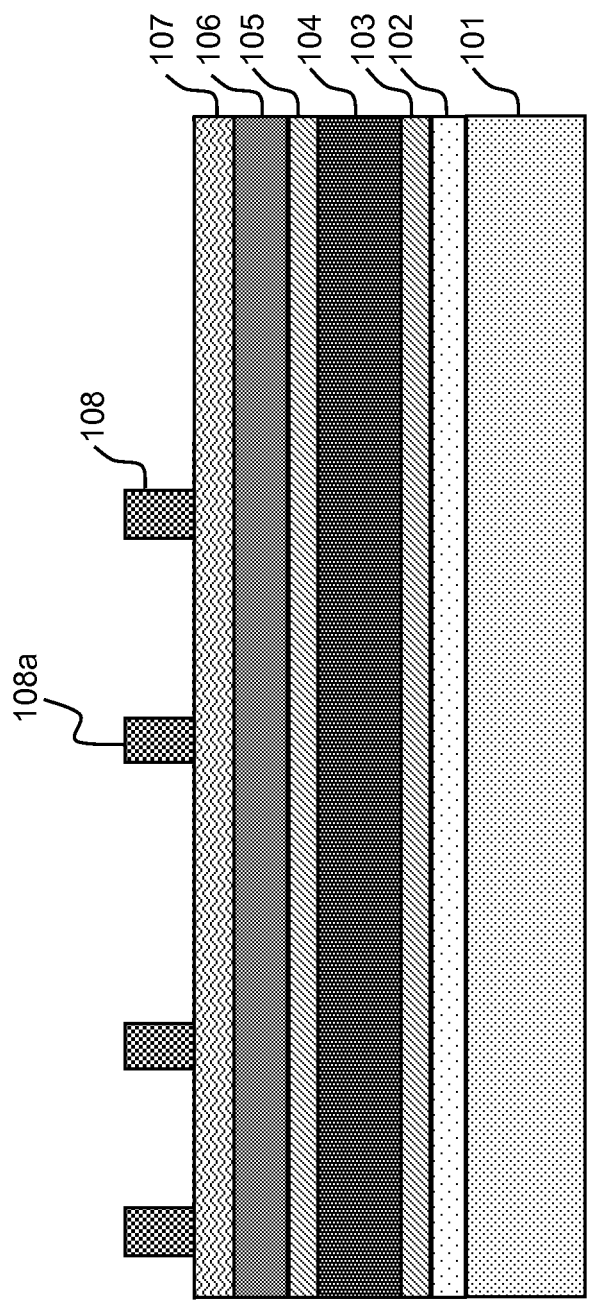
FIG. 1 is a demonstrative illustration of cross-sectional view of a structure in a stop of a method of forming a device through an improved sidewall image transfer process according to one embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIGS. 1-12 are demonstrative illustrations of cross-sectional views of structures in a method of forming a semiconductor structure or device 100 (FIG. 12) according to embodiments of the present invention. As some non-limiting examples, semiconductor structure 100 may be, for example, a back-end-of-line (BEOL) or mid-of-line (MOL) interconnect structure, or may be a front-end-of-line (FEOL) device structure which includes, for example, high-k metal gate semiconductor transistor devices.

For example, FIG. 1 is a demonstrative illustration of cross-sectional view of a structure in a step of a method of forming a device through an improved sidewall image transfer process according to one embodiment of the present invention. More specifically, the method may start with forming a stack of layers on top of a substrate 101 therein a pattern of the device is to be formed. Specifically, the stack of layers may include, for example and starting from substrate 101, a dielectric cap layer 102; a first hard mask layer 103; a first planarization layer 104; a second hard mask layer 105; a second planarization layer 106; and an anti-reflective coating (ARC) layer 107, all of which may be formed on top of one another and in sequence.

In one embodiment, substrate layer 101 at the bottom of the stack may be any dielectric materials suitable for BEOL or MOL interconnect structures, and/or may be any gate materials suitable for FEOL structures. In some other embodiments, substrate layer 101 may be a semiconductor material or a dielectric material on top of a semiconductor material. Dielectric cap layer 102 may include silicon oxide and may be formed, for example, from a tetraethyl orthosilicate (TEOS) precursor to have a thickness ranging from about 10 nanometers (nm) to about 100 nm in some embodiments. First and second hard mask layers 103 and 105 may include metal-nitride, such as titanium-nitride (TiN), boron-nitride (BN), and/or metal-oxide and may have a thickness ranging from about 10 nm to about 70 nm according to different embodiments. First and second hard mask layers 103 and 105 may preferably, although not necessarily, be formed to have the same or close to the same thickness thereby facilitating an etching process as being described below in more details. First planarization layer 104 may be an organic planarization layer (OPL) or a layer of material that is capable of providing planarization whereupon second hard mask layer 105 may be formed through deposition. For example, when second hard mask layer 105 is a TiN layer, first planarization layer 104 may be, for example, an amorphous carbon layer that may be able to withstand the high temperature of depositing TiN on top thereof without causing degassing or decomposition of the material. First planarization layer 104 may preferably have a thickness ranging from about 10 nm to about 100 nm as being described below in more details. Second planarization layer 106 may be an organic planarization layer as well, such as a polymer layer in some embodiments, and may have a thickness ranging from about 50 nm to about 400 nm in some embodiments. ARC layer 107 may include silicon (Si) in some embodiments and thus may be referred to as SiARC layer 107 or a bottom anti-reflective coating layer (BARC). ARC layer 107 may have a thickness ranging from about 20 nm to about 100 nm in some embodiments.

The method, according to embodiment of the present invention, may further include forming a photo-resist layer 108 on top of ARC layer 107 and forming a first resist pattern 108a in photo-resist layer 108. Material of photo-resist layer 108 may be any appropriate type of photo-resist materials, which may partly depend upon the device patterns to be formed and the exposure method used. For example, material of photo-resist layer 108 may include a single exposure resist suitable for, for example, argon fluoride (ArF); a double exposure resist suitable for, for example, thermal cure system; and/or an extreme ultraviolet (EUV) resist suitable for, for example, an optical process. Photo-resist layer 108 may be formed to have a thickness ranging from about 30 nm to about 150 nm in various embodiments. First resist pattern 108a may be formed by applying any appropriate photo-exposure method in consideration of the type of photo-resist material 108 being used. In some embodiment, the formation of first resist pattern 108a may be a mandrel forming step using a photo-lithographic process.

Figure 2:
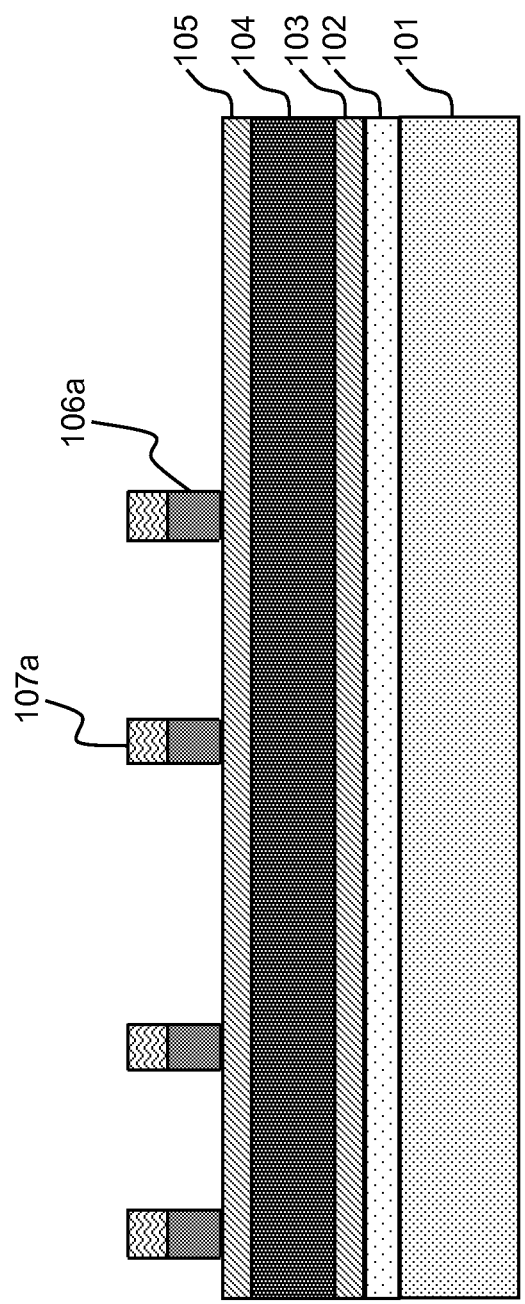
FIG. 2 is a demonstrative illustration of cross-sectional view of a structure in a stop of a method of forming a device through an improved sidewall image transfer process, following the step shown in FIG. 1, according to one embodiment of the present invention.

FIG. 2 is a demonstrative illustration of cross-sectional view of a structure in a step of a method of forming a device through an improved sidewall image transfer process, following the step shown in FIG. 1, according to one embodiment of the present invention. More specifically, the method includes transferring first resist pattern 108a into second planarization layer 106 which may also be known, and referred to hereinafter, as an under-layer 106. The transferring of first resist pattern 108a may be performed by etching SiARC layer 107 and under-layer 106 to create SiARC pattern 107a and under-layer pattern 106a in a directional etching process such as a reactive-ion-etching (RIE) process. In the RIE process, first resist pattern 108a is used as a mask and second hard mask layer 105 is used as an etch-stop layer whose material may be carefully selected to provide high etch-selectivity relative to under-layer 106. First resist pattern 108a may be lifted off during the etching of under-layer 106a, which is covered by SiARC pattern 107a and may serve as mandrels in the following steps. The structure shown in FIG. 2 is now ready for the next step of sidewall image transfer using under-layer pattern 106a as mandrels.

It is to be noted that mandrels 106a made of under-layer or second planarization layer 106 are now formed directly on top of hard mask layer 105 according to embodiment of the present invention, instead of an ARC layer as is commonly found in prior art. During a conventional sidewall image transfer process, an ARC layer such as a SiARC layer underneath mandrels is known to be problematic for causing, for example, LER formation, uneven etch shrink and hence CD (critical dimension) variation and pitch walking. The formation of mandrels directly on top of a hard mask layer instead of a SiARC layer avoids the above problems.

Figure 3:
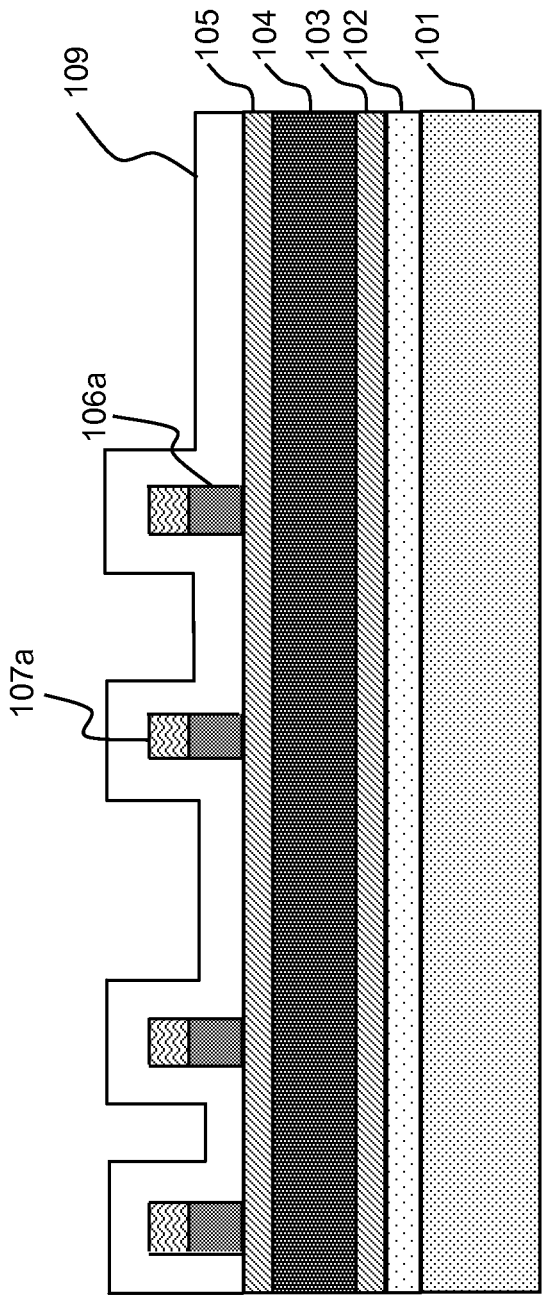
FIG. 3 is a demonstrative illustration of cross-sectional view of a structure in a stop of a method of forming a device through an improved sidewall image transfer process, following the step shown in FIG. 2, according to one embodiment of the present invention.

FIG. 3 is a demonstrative illustration of cross-sectional view of a structure in a step of a method of forming a device through an improved sidewall image transfer process, following the step shown in FIG. 2, according to one embodiment of the present invention. More specifically, the method includes depositing a layer of dielectric material 109 directly on top of under-layer pattern 106a and exposed portions of second hard mask layer 105. The deposition may be made a conformal deposition process, using any known or future developed deposition techniques, to create dielectric layer 109 having a substantially uniform thickness. In one embodiment, material of dielectric layer 109 may include, for example, silicon nitride or low temperature silicon oxide.

Figure 4:
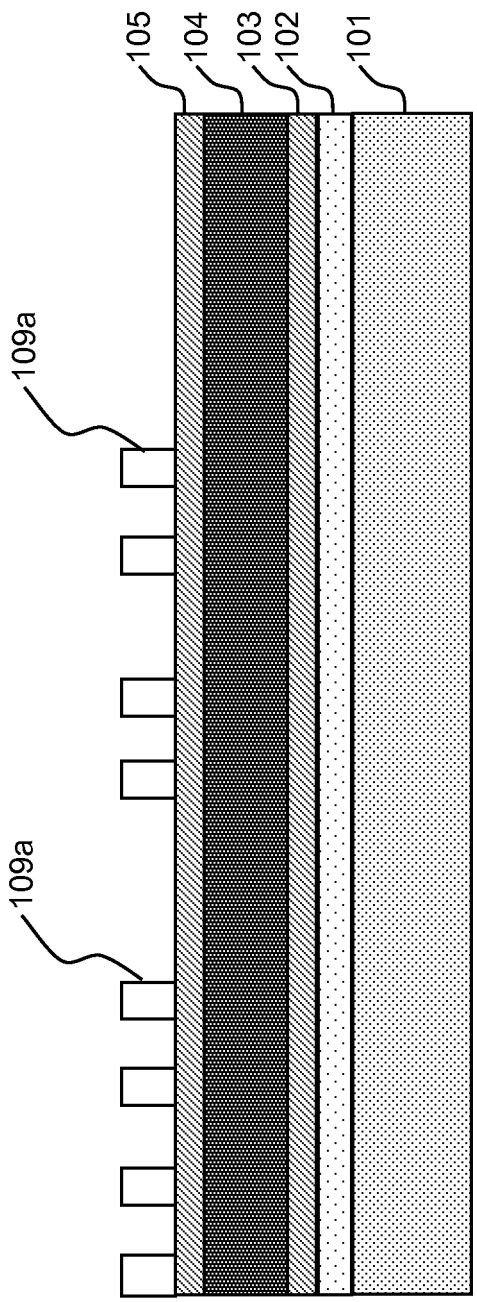
FIG. 4 is a demonstrative illustration of cross-sectional view of a structure in a stop of a method of forming a device through an improved sidewall image transfer process, following the step shown in FIG. 3, according to one embodiment of the present invention.

After the deposition and according to one embodiment, dielectric layer 109 may be subjected to a directional etching process such as a RIE process. As being demonstratively illustrated in FIG. 4, the directional etching process may remove most of dielectric layer 109, from the top of second hard mask layer 105 and from the top of under-layer pattern 106a, to leave only a portion of dielectric layer 109 at the sidewalls of mandrels 106a, forming sidewall spacers 109a. Here, it is to be noted that FIG. 4 is for illustration purpose and generally sidewall spacers 109a may have slightly different shape from those illustrated in FIG. 4, such as rounded corners that may be naturally formed during the directional etching process as is known in the art. According to another embodiment, the formation of sidewall spacers 109a may be made after a block-litho process, being described below in more details, which blocks some features (to be formed around mandrel or under-layer pattern 106a) from being transferred to substrate 101. During etch-back in forming sidewall spacers 109a, SiARC pattern 107a may be removed as well. In one embodiment, SiARC 107a may be removed (or thinned down) from the top of under-layer pattern 106a before dielectric layer 109 is deposited. After directional etching of dielectric layer 109 which forms sidewall spacers 109a, in one embodiment, under-layer pattern or mandrel 106a may be pulled out and the pulling out may be performed in an oxygen-containing plasma in which the dielectric sidewall spacers 109a won't be trimmed. In another embodiment, mandrel layer 106a may be pulled out in a subsequent step, during the patterning of a block litho mask, together with a gap-filling layer that is deposited on top thereof.

Figure 5:
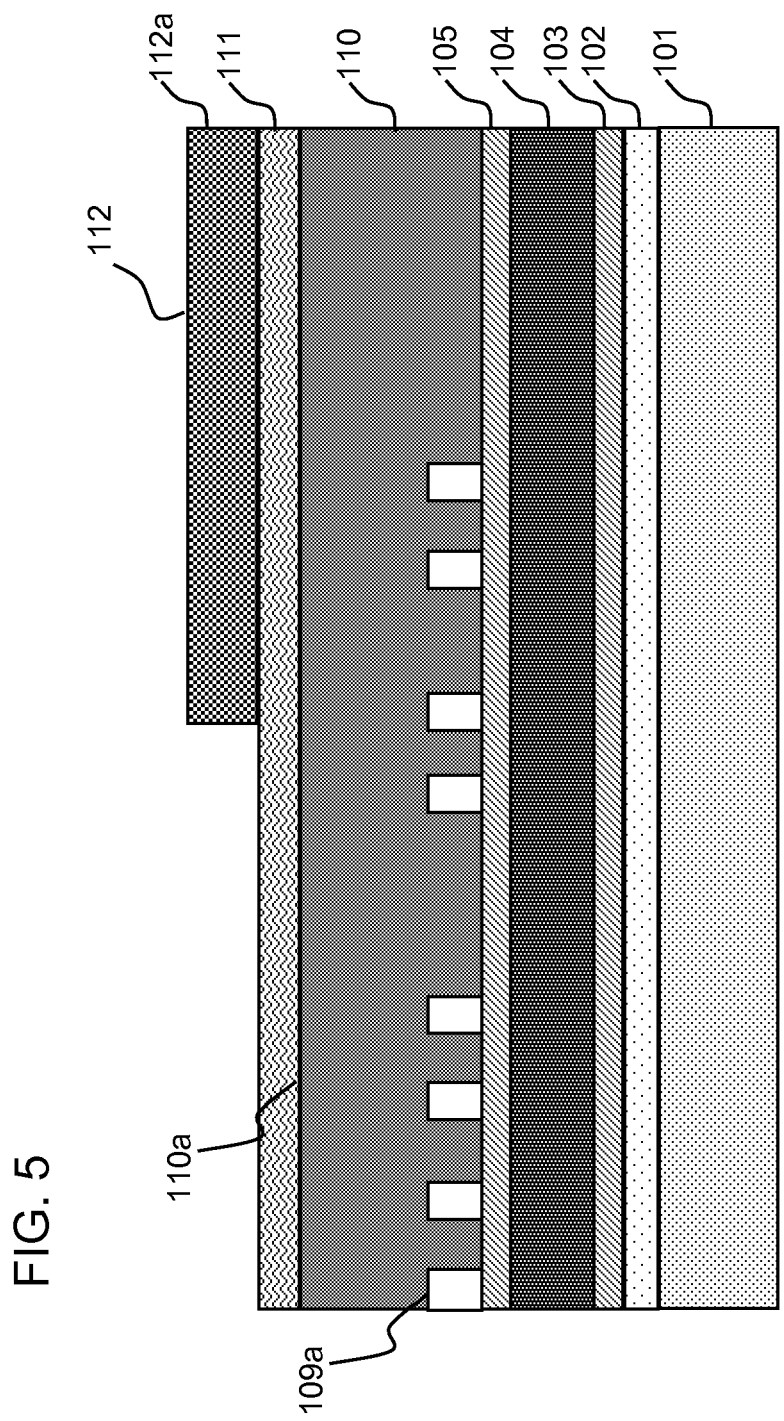
FIG. 5 is a demonstrative illustration of cross-sectional view of a structure in a stop of a method of forming a device through an improved sidewall image transfer process, following the step shown in FIG. 4, according to one embodiment of the present invention.

FIG. 5 is a demonstrative illustration of cross-sectional view of a structure in a step of a method of forming a device through an improved sidewall image transfer process, following the step shown in FIG. 4, according to one embodiment of the present invention. This step, known as a block litho step, is performed to block or prevent a portion of under-layer pattern 106a from being transferred to substrate 101 in subsequent steps in order to create predetermined device structures. During this step, a blocking mask 112a, which may be a photo-resist mask for example, may be used to cover portions of the under-layer pattern 106a that are not intended to be transferred. In order to form blocking mask 112a, the method includes depositing a gap-filling layer 110 to fill in the gap between spacers 109a, and then planarizing this gap-filling layer 110 to create a flat top surface 110a. Gap-filling layer 110 may preferably be made of the same material as that of second planarization layer 106 that forms mandrels 106a, if mandrels 106a are to be removed in the following patterning step of block litho mask, but different material may be used as well. On top of gap-filling layer 110, the method may include depositing an anti-reflective coating (ARC) layer 111 and a photo-resist layer 112 on top of ARC layer 111. Photo-resist layer 112 is then lithographically exposed and developed to create blocking mask 112a.

Figure 6:
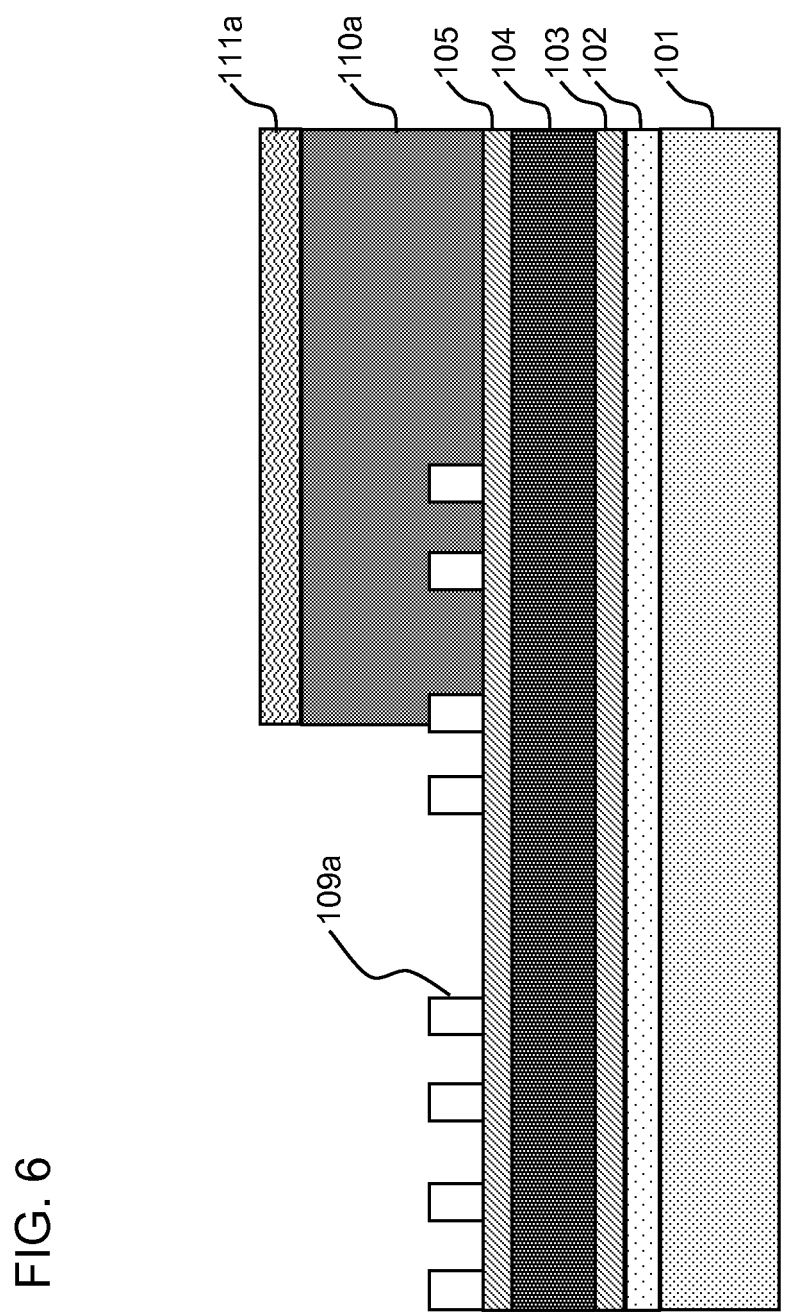
FIG. 6 is a demonstrative illustration of cross-sectional view of a structure in a stop of a method of forming a device through an improved sidewall image transfer process, following the step shown in FIG. 5, according to one embodiment of the present invention.

FIG. 6 is a demonstrative illustration of cross-sectional view of a structure in a step of a method of forming a device through an improved sidewall image transfer process, following the step shown in FIG. 5, according to one embodiment of the present invention. More specifically, the method includes selectively removing portions of ARC layer 111 and gap-filling layer 110 that are not covered by blocking mask 112a by, for example, applying a directional RIE etching process to create a pattern of gap-filling layer 110a and SiARC layer 111a underneath the original blocking mask 112a that may be etched away at the end of gap filling layer 110a RIE etch process. The etching process also removes the gap-filling layer 110 between any two sidewall spacers 109a (or underlayer pattern or mandrel 106a), which are exposed by the removal of gap-filling layer 110. According to one embodiment, the method uses hard mask layer 105 as an etch-stop layer during the removal of gap-filling layer 110, to leave sidewall spacers 109a on top of second hard mask layer 105. The use of hard mask layer 105, instead of a SiARC layer, reduces and/or eliminates the possibility of causing defects that is known to be associated with the process of removing/lifting mandrels, as being described below in more details.

Figure 7:
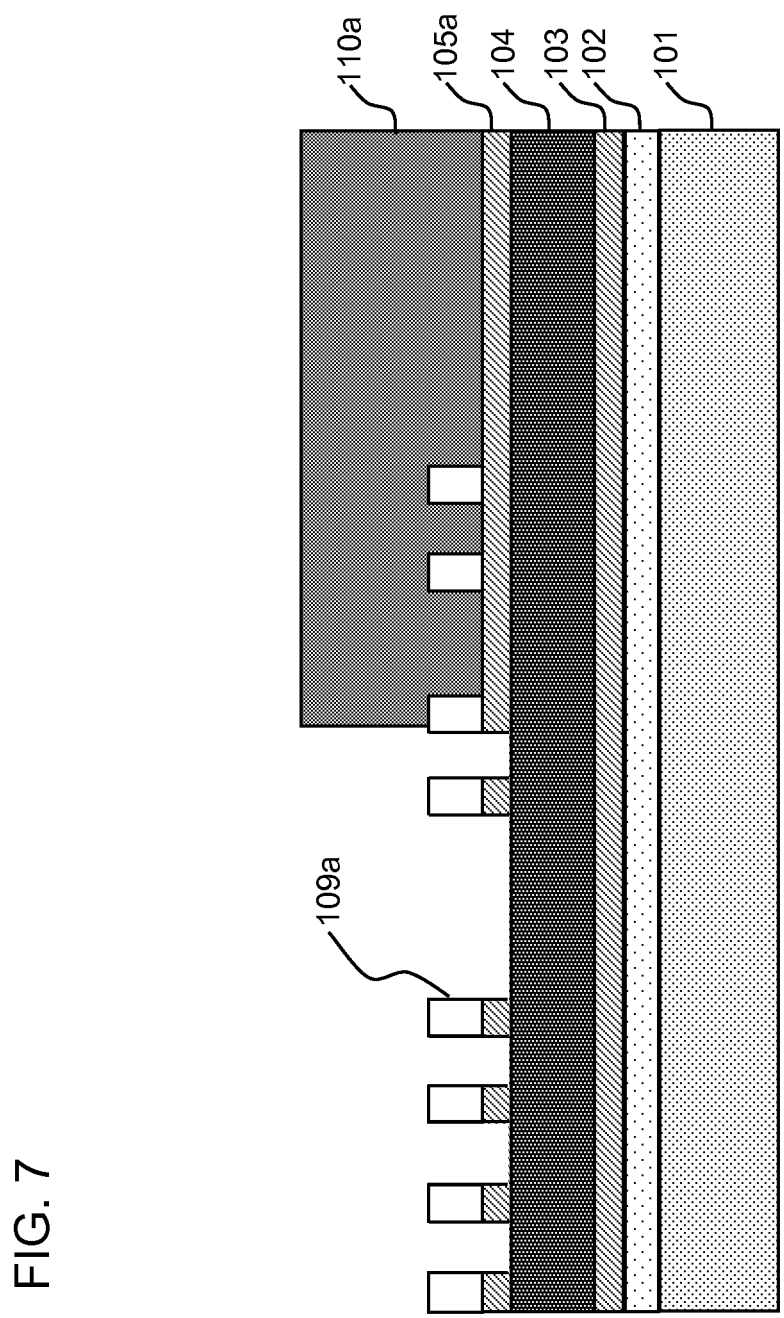
FIG. 7 is a demonstrative illustration of cross-sectional view of a structure in a stop of a method of forming a device through an improved sidewall image transfer process, following the step shown in FIG. 6, according to one embodiment of the present invention.

FIG. 7 is a demonstrative illustration of cross-sectional view of a structure in a step of a method of forming a device through an improved sidewall image transfer process, following the step shown in FIG. 6, according to one embodiment of the present invention. More specifically, the method includes transferring the pattern of sidewall spacers 109a into the second hard mask layer 105 forming a hard mask pattern 105a. The transferring of sidewall spacer pattern 109a may be through an etching process such as a RIE process. It is to be noted that because sidewall spacers 109a situate directly on top of hard mask layer 105, instead of a SiARC layer as being often used in prior art, problems such as CD variation and pitch walking that are normally associated with SiARC layer caused by uneven thickness of SiARC layer at mandrel-defined and spacer-defined trenches no longer exist. Moreover, the LER formation will be under control as high etching selectivity may be achieved between sidewall spacer 109a and hard mask layer 105. In other words, hard mask pattern 105a relatively accurately reflect the pattern formed by sidewall spacers 109a. Thereafter, SiARC layer 111a may be removed or lifted off. Preferably, SiARC layer 111a is removed or lifted off before or by the end of hard mask layer 105a patterning in order to enable and/or ease the strip-off of gap-filling layer 110a during the amorphous carbon layer 104 etch, which is described below in more details with reference to FIG. 8.

Figure 8:
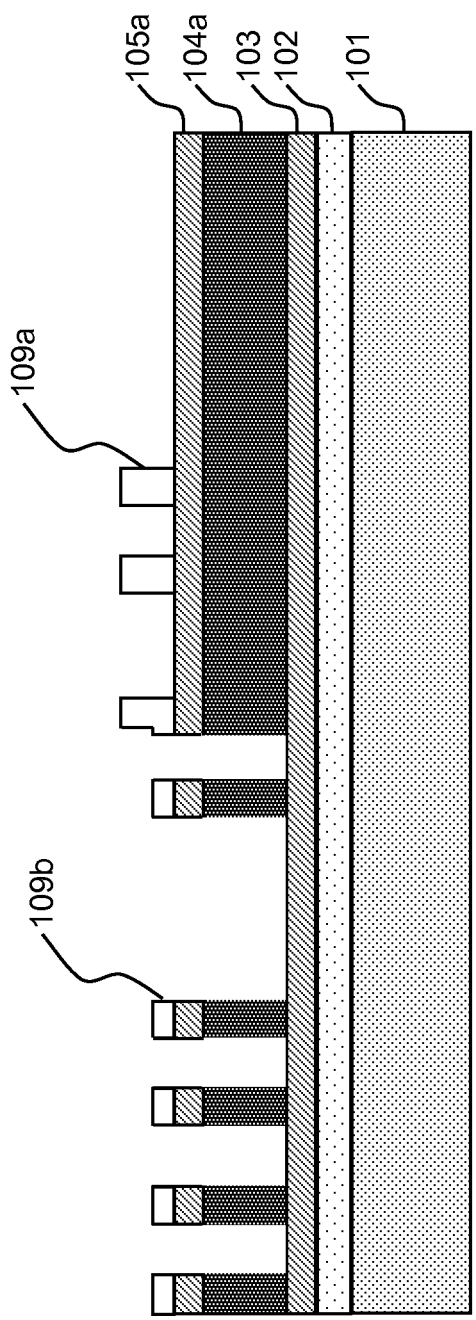
FIG. 8 is a demonstrative illustration of cross-sectional view of a structure in a stop of a method of forming a device through an improved sidewall image transfer process, following the step shown in FIG. 7, according to one embodiment of the present invention.

FIG. 8 is a demonstrative illustration of cross-sectional view of a structure in a step of a method of forming a device through an improved sidewall image transfer process, following the step shown in FIG. 7, according to one embodiment of the present invention. More specifically, the method includes using hard mask pattern 105a as a mask to etch exposed first planarization layer 104, which may be for example an amorphous carbon layer, underneath thereof to form an amorphous carbon layer pattern 104a that represents hard mask pattern 105a. The process of etching amorphous carbon layer 104 may also remove part of sidewall spacers 109a, that are not covered by gap-filling 111a (FIG. 7), to become height-reduced sidewall spacers 109b. However, such partial removal of sidewall spacers 109a is not essential, whether being removed partially or not being removed at all, because sidewall spacers 109a will be subjected to a separate removal process, such as a burn-off process, at a later stage. The method also includes removing gap-filling layer 110a by the end of amorphous carbon layer 104 etch.

Figure 9:
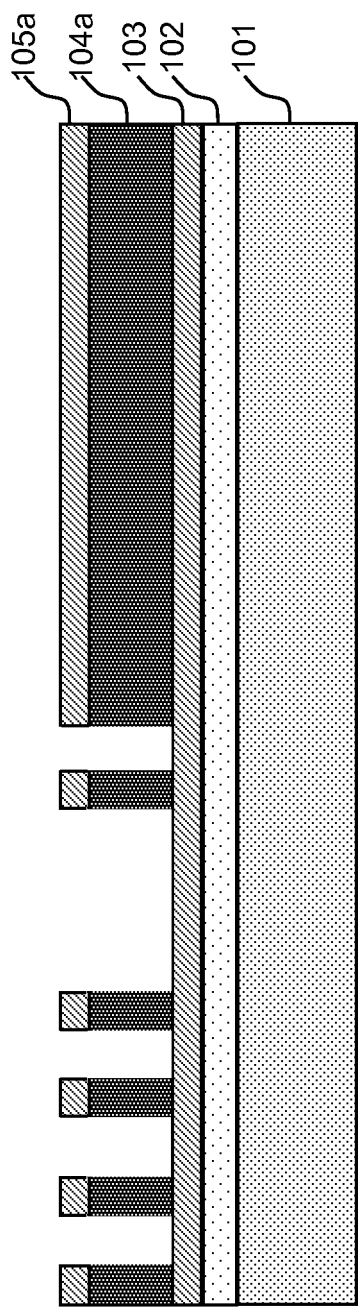
FIG. 9 is a demonstrative illustration of cross-sectional view of a structure in a stop of a method of forming a device through an improved sidewall image transfer process, following the step shown in FIG. 8, according to one embodiment of the present invention.

FIG. 9 is a demonstrative illustration of cross-sectional view of a structure in a step of a method of forming a device through an improved sidewall image transfer process, following the step shown in FIG. 8, according to one embodiment of the present invention. More specifically, the method includes removing, such as burning-off, sidewall spacers 109a and/or 109b that are on top of hard mask pattern 105a as well as those in the areas that were previously covered by litho block mask 112a. The dielectric sidewall spacers 109a and 109b may be burned off in a fluorocarbon and noble gas (CxFy) plasma and/or hydrogenated fluorocarbon gas (CHxFy) plasma environment. In one embodiment, the plasma may contain about 10 sccm of fluorocarbon gas such as C4F8 (CxFy when x=4, y=8), about 1000 sccm of Ar, with lower RF power of about 690 W, and pressure of about 50 mtorr and the burn-off may be performed in a capacitive coupled plasma reactor. In another embodiment, the burn-off plasma chemistry may contain fluorocarbon gas such as CF4 (CxFy when x=1, y=4), hydrogenated fluorocarbon gas CHxFy, diluting gases such as Ar and/or nitrogen. During this sidewall spacer burn-off process, only the spacers on top of hard mask 105a need to be removed while in prior art where there is a SiARC, mask underneath the sidewall spacers, which requires to be removed as well. Embodiment of the present invention requires only the removal of sidewall spacers 109a and/or 109b resulting in a more robust process as far as preventing patterning defects such as pattern wiggling or flop over is concerned.

Figure 10:
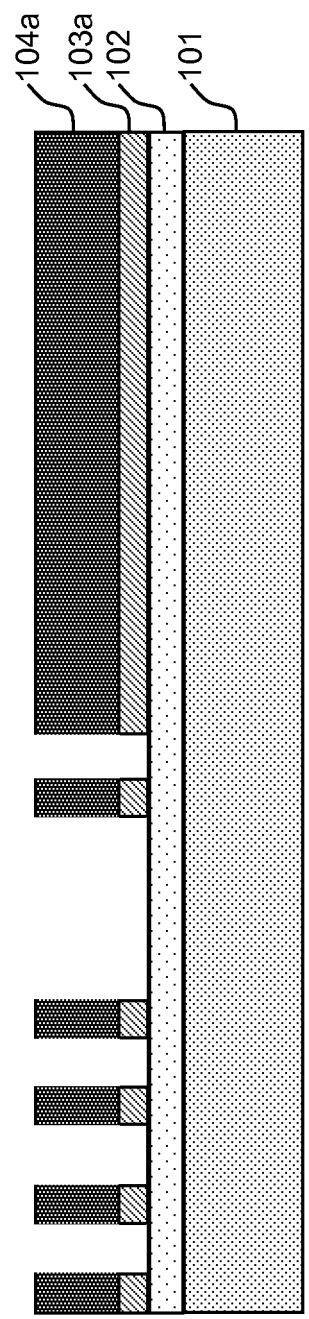
FIG. 10 is a demonstrative illustration of cross-sectional view of a structure in a stop of a method of forming a device through an improved sidewall image transfer process, following the step shown in FIG. 9, according to one embodiment of the present invention.

FIG. 10 is a demonstrative illustration of cross-sectional view of a structure in a step of a method of forming a device through an improved sidewall image transfer process, following the step shown in FIG. 9, according to one embodiment of the present invention. More specifically, the method includes transferring amorphous carbon layer pattern 104a, which represents second hard mask pattern 105a, into first hard mask layer 103 to create a first hard mask pattern 103a. The transferring may be made through a directional etching process such as a RIE process. According to one embodiment, the method of present invention utilizes second hard mask pattern 105a as a sacrificial masking layer and therefore reduces the need for a thick amorphous carbon layer pattern 104a to be used as a mask layer. In fact, when the thickness of second hard mask pattern 105a is equal to or thicker than that of first hard mask layer 103, thickness of amorphous carbon layer pattern 104a may be dramatically reduced because amorphous carbon layer pattern 104a may ever be consumed during the etching of first hard mask layer 103 and may always be protected by second hard mask pattern 105a. Therefore, for example, thickness of amorphous carbon layer 104 may be reduced to for example around 10 nm or even less. In this situation, the use of amorphous carbon layer 104 may be primarily for the purpose of preserving fidelity of the pattern of second hard mask pattern 105a, which originally comes from sidewall spacer pattern 109a.

Figure 11:
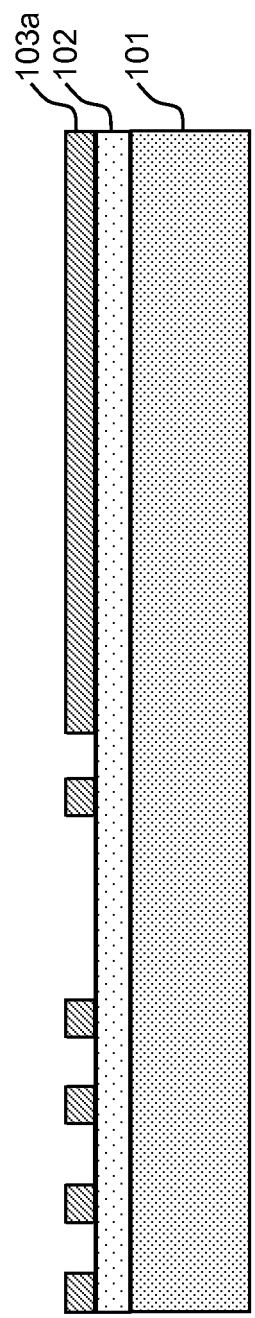
FIG. 11 is a demonstrative illustration of cross-sectional view of a structure in a stop of a method of forming a device through an improved sidewall image transfer process, following the step shown in FIG. 10, according to one embodiment of the present invention.
Figure 12:
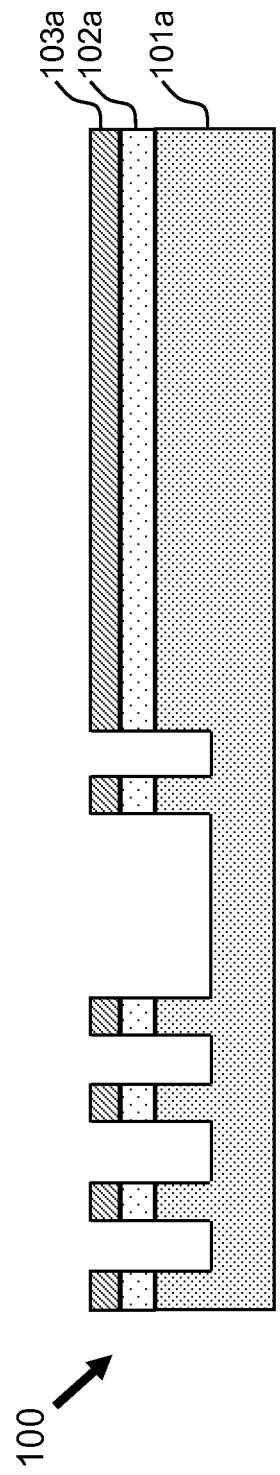
FIG. 12 is a demonstrative illustration of cross-sectional view of a structure in a stop of a method of forming a device through an improved sidewall image transfer process, following the step shown in FIG. 11, according to one embodiment of the present invention.

After transferring amorphous carbon layer pattern 104a into first hard mask layer 103 to form first hard mask pattern 103a, the method includes lifting amorphous carbon layer pattern 104a to leave only first hard mask pattern 103a on top of substrate 101, via a dielectric cap layer 102, as is demonstratively illustrated in FIG. 11. The first hard mask pattern 103a demonstrates a much higher fidelity to the sidewall spacer pattern 109a as being defined by the original mandrels 106a when being compared with those achieved by processes of prior art. The first hard mask pattern 103a is subsequently transferred into substrate 101 through a dielectric etching process as is demonstratively illustrated in FIG. 12. First hard mask layer 103a may subsequently be removed, if necessary, leaving only the device structures as being represented by the transferred mandrel pattern, in substrate 101.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   forming a set of sidewall spacers next to a plurality of mandrels, said set of sidewall spacers being directly on top of a second hard-mask layer;
   forming a photo-resist block mask, said photo-resist block mask exposing at least a portion of said set of sidewall spacers and covering rest of said set of sidewall spacers;
   transferring image of said at least a portion of said set of sidewall spacers to said second hard-mask layer to form a device pattern; and
   transferring said device pattern from said second hard-mask layer to a substrate underneath said second hard-mask layer, including transferring said device pattern to a first hard-mask layer, said first hard-mask layer being underneath said second hard-mask layer and separated from thereof by a planarization layer, said planarization layer being an amorphous carbon layer.

2. The method of claim 1, wherein forming said set of sidewall spacers comprises:
   creating said plurality of mandrels from a planarization layer, said planarization layer being directly on top of said hard-mask layer;
   depositing a conformal layer of dielectric material suitable for said sidewall spacers covering said plurality of mandrels; and
   performing directional etching of said conformal layer to create said set of sidewall spacers.

3. The method of claim 2, wherein creating said plurality of mandrels comprises:
   depositing an anti-reflective coating layer on top of said planarization layer;
   forming a photo-resist pattern of said plurality of mandrels lithographically on top of said anti-reflective coating layer;
   transferring said photo-resist pattern into said planarization layer through directional etching of said planarization layer utilizing said hard-mask layer underneath thereof as an etch-stop layer.

4. The method of claim 1, further comprising removing said sidewall spacers remaining on top of said device pattern of said second hard-mask layer and the rest of said second hard-mask layer through a burn-off process.

5. The method of claim 4, wherein said burn-off process comprises subjecting said sidewall spacers to a plasma environment, wherein said plasma environment comprises fluorocarbon gas of CF4 or C4F8, hydrogenated fluorocarbon gas CHxFy, and diluting gas of Ar or nitrogen.

6. The method of claim 1, wherein said first and second hard-mask layers are titanium-nitride layers and wherein said planarization layer is of a material that is able to withstand a process of depositing said second titanium-nitride layer on top thereof without causing decomposition.

7. The method of claim 1, wherein said second hard-mask layer has a thickness that is equal or less than that of said first hard-mask layer, and wherein said planarization layer has a thickness ranging from about 10 nm to about 100 nm.

8. A method of performing sidewall spacer image transfer, said method comprising:
   forming a set of sidewall spacers next to a set of mandrels respectively, said set of sidewall spacers being directly on top of a second hard-mask layer;
   transferring image of at least a portion of said set of sidewall spacers to said second hard-mask layer to form a device pattern; and
   transferring said device pattern from said second hard-mask layer to a first hard-mask layer and subsequently to a substrate underneath said first hard-mask layer,
   wherein said first and second hard-mask layers are titanium-nitride layers separated by a planarization layer, said planarization layer is of a material that is able to withstand a process of depositing said second titanium-nitride layer on top thereof without causing decomposition.

9. The method of claim 8, wherein forming said set of sidewall spacers comprises:
   creating said set of mandrels from a planarization layer, said planarization layer being directly on top of said second hard-mask layer;
   depositing a conformal layer of dielectric material covering said set of mandrels, said dielectric material being suitable for said sidewall spacers; and
   performing directional etching to remove said conformal layer thereby leaving only said set of sidewall spacers at sidewalls of said set of mandrels.

10. The method of claim 9, wherein creating said set of mandrels comprises:
    depositing an anti-reflective coating layer on top of said planarization layer;
    exposing lithographically a photo-resist layer on top of said anti-reflective coating layer to form a photo-resist pattern of said set of mandrels;
    transferring said photo-resist pattern into said planarization layer through directional etching of said planarization layer utilizing said second hard-mask layer as an etch-stop layer.

11. The method of claim 8, further comprising forming a photo-resist mask to cover rest of said set of sidewall spacers except said at least a portion of said set of sidewall spacers, before image of said at least a portion of said set of sidewall spacers is transferred to said second hard-mask layer.

12. The method of claim 11, further comprising removing said sidewall spacers remaining on top of said device pattern of said second hard-mask layer and the rest of said second hard-mask layer through a burn-off process, said burn-off process comprises subjecting said sidewall spacers to a plasma environment, wherein said plasma environment comprises fluorocarbon gas of CF4 or C4F8, hydrogenated fluorocarbon gas CHxFy, and diluting gas of Ar or nitrogen.

13. The method of claim 8, wherein said planarization layer between said first and said second hard-mask layer is an amorphous carbon layer.

14. The method of claim 8, wherein said second hard-mask layer has a thickness that is equal or less than that of said first hard-mask layer, and wherein said planarization layer has a thickness ranging from about 10 nm to about 100 nm.

15. A method of transferring sidewall spacer image comprising:
    forming a set of sidewall spacers next to sidewalls of a corresponding set of mandrels, said set of sidewall spacers being directly on top of a second hard-mask layer;
    transferring image of a portion of said set of sidewall spacers to said second hard-mask layer to form a device pattern;
    transferring said device pattern from said second hard-mask layer to a first hard-mask layer; and
    transferring said device pattern from said first hard-mask layer subsequently to a substrate underneath said first hard-mask layer,
    wherein said first and second hard-mask layers are titanium-nitride layers separated by a planarization layer, said planarization layer is of a material that is able to withstand a process of depositing said second titanium-nitride layer on top thereof without causing decomposition.

16. The method of claim 15, wherein forming said set of sidewall spacers comprises:
    depositing a planarization layer on top of said second hard-mask layer;
    etching said planarization layer to form thereby said set of mandrels;
    depositing a conformal layer of dielectric material covering said set of mandrels, said dielectric material being suitable for said sidewall spacers; and
    performing directional etching to remove said conformal layer thereby leaving only said set of sidewall spacers at sidewalls of said set of mandrels.

17. The method of claim 16, wherein forming said set of mandrels comprises:
    depositing an anti-reflective coating layer on top of said planarization layer;
    exposing lithographically a photo-resist layer on top of said anti-reflective coating layer to form a photo-resist pattern of said set of mandrels;
    transferring said photo-resist pattern into said planarization layer through a directional etching process utilizing said second hard-mask layer as an etch-stop layer.

18. The method of claim 15, further comprising, before image of said at least a portion of said set of sidewall spacers being transferred to said second hard-mask layer, forming a photo-resist mask that covers rest of said set of sidewall spacers except said at least a portion of said set of sidewall spacers.

19. The method of claim 18, further comprising removing said sidewall spacers remaining on top of said device pattern of said second hard-mask layer and the rest of said second hard-mask layer through a burn-off process, said burn-off process comprises subjecting said sidewall spacers to a plasma environment, wherein said plasma environment comprises fluorocarbon gas of CF4 or C4F8, hydrogenated fluorocarbon gas CHxFy, and diluting gas of Ar or nitrogen.

20. The method of claim 15, wherein said planarization layer between said first and said second hard-mask layer is an amorphous carbon layer.

21. The method of claim 15, wherein said second hard-mask layer has a thickness that is equal or less than that of said first hard-mask layer, and wherein said planarization layer has a thickness ranging from about 10 nm to about 100 nm.

* * * * *